US009209620B2

(12) United States Patent (10) Patent No.: US 9,209,620 B2
Fan et al. (45) Date of Patent: Dec. 8, 2015

(54) COMBINATION ESD PROTECTION CIRCUITS AND METHODS

(71) Applicant: Micron Technology, Inc., Boise, ID (US)

(72) Inventors: Xiaofeng Fan, Santa Clara, CA (US); Michael D. Chaine, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 14/109,080

(22) Filed: Dec. 17, 2013

(65) Prior Publication Data

US 2014/0104733 A1 Apr. 17, 2014

Related U.S. Application Data

(63) Continuation of application No. 13/216,147, filed on Aug. 23, 2011, now Pat. No. 8,611,058.

(51) Int. Cl.
| | |
|---|---|
| *H02H 9/00* | (2006.01) |
| *H02H 9/04* | (2006.01) |
| *H01L 27/06* | (2006.01) |
| *H01L 27/02* | (2006.01) |
| *H01L 27/08* | (2006.01) |

(52) U.S. Cl.
CPC ............ *H02H 9/044* (2013.01); *H01L 27/0259* (2013.01); *H01L 27/0262* (2013.01); *H01L 27/0617* (2013.01); *H02H 9/046* (2013.01); *H01L 27/0817* (2013.01)

(58) Field of Classification Search
USPC .......................................................... 361/56
See application file for complete search history.

(56) References Cited

U.S. PATENT DOCUMENTS

| | | | |
|---|---|---|---|
| 5,691,213 A | 11/1997 | Chang et al. | |
| 5,793,066 A | 8/1998 | Ajit | |
| 5,895,940 A * | 4/1999 | Kim .............................. | 257/173 |
| 6,130,811 A | 10/2000 | Gans et al. | |
| 6,218,881 B1 | 4/2001 | Hiraga | |
| 6,233,130 B1 | 5/2001 | Lin | |
| 6,441,437 B1 | 8/2002 | Gossner | |
| 6,492,208 B1 | 12/2002 | Cheng et al. | |

(Continued)

FOREIGN PATENT DOCUMENTS

| | | |
|---|---|---|
| KR | 2001-0024361 | 3/2001 |
| KR | 2010-0003569 | 1/2010 |

OTHER PUBLICATIONS

"International Search Report", International Search Report for PCT/US2012/051470 dated Mar. 4, 2013.

(Continued)

*Primary Examiner* — Dharti Patel
(74) *Attorney, Agent, or Firm* — Dorsey & Whitney LLP (57) ABSTRACT

Circuits, integrated circuits, apparatuses, and methods, such as those for protecting circuits against electrostatic discharge events are disclosed. In an example method, a thyristor is triggered to conduct current from a signal node to a reference voltage node using leakage currents provided by a transistor formed in a semiconductor doped well shared with the base of the thyristor. The leakage currents are responsive to a noise event (e.g., electrostatic discharge (ESD) event) at the signal node, and increase the voltage of the semiconductor doped well to forward bias the base and the collector of the thyristor. The triggered thyristor conducts the current resulting from the ESD event to the reference voltage node.

19 Claims, 8 Drawing Sheets

(56) References Cited

U.S. PATENT DOCUMENTS

| | | |
|---|---|---|
| 6,680,833 B2 | 1/2004 | Morishita |
| 6,690,557 B2 | 2/2004 | Hung et al. |
| 6,850,397 B2 | 2/2005 | Russ et al. |
| 7,659,765 B2 | 2/2010 | Ito |
| 7,825,473 B2 | 11/2010 | Ker et al. |
| 7,869,175 B2 | 1/2011 | Song |
| 7,910,950 B1 | 3/2011 | Vashchenko et al. |
| 7,911,749 B2 | 3/2011 | Lai |
| 8,611,058 B2 * | 12/2013 | Fan et al. ............ 361/56 |
| 2002/0109950 A1 | 8/2002 | Marr |
| 2002/0153571 A1 | 10/2002 | Mergens et al. |
| 2003/0011949 A1 | 1/2003 | Ker et al. |
| 2003/0107406 A1 | 6/2003 | Li et al. |
| 2004/0100745 A1 | 5/2004 | Chen et al. |
| 2006/0043487 A1 | 3/2006 | Pauletti et al. |
| 2006/0091464 A1 | 5/2006 | Hiraoka |
| 2006/0244071 A1 | 11/2006 | Kondo |
| 2007/0058307 A1 | 3/2007 | Mergens et al. |
| 2008/0055804 A1 | 3/2008 | Van Camp |
| 2008/0180869 A1 | 7/2008 | Sugahara |
| 2009/0273867 A1 | 11/2009 | Whitfield et al. |
| 2010/0109043 A1 | 5/2010 | Wang et al. |
| 2010/0172059 A1 | 7/2010 | Chaine et al. |
| 2012/0170160 A1 * | 7/2012 | Wang et al. ............ 361/56 |
| 2013/0050886 A1 | 2/2013 | Fan |
| 2013/0050887 A1 | 2/2013 | Fan |
| 2014/0218830 A1 | 8/2014 | Chaine et al. |
| 2014/0240883 A1 | 8/2014 | Fan et al. |

OTHER PUBLICATIONS

"Written Opinion", Written Opinion for PCT/US2012/051470 dated Mar. 4, 2013.

Bruck, et al., "Efficient Algorithms for All-to-All Communications in Multiport Message-Passing Systems", IEEE Transactions onParallel and Distributed Systems, vol. 8, No. 11, Nov. 1997, pp. 1143-1156.

Diks and Pelc, , "Broadcasting with Universal Lists", Proceedings of the 28th Hawaii International Conference on System Sciences (HICSS 1995); IEEE 1995, pp. 564-573.

Keppens, et al., "ESD Protection Solutions for High Voltage Technologies", EOS/ESD Symposium 04, pp. 289-298.

Mergens, et al., "Biode-Triggered SCR (DTSCR) for RF-ESD Protection of BiCMOS SiGe HBTs and CMOS Ultra-Thin Gate Oxides", IEEE 2003, pp. 515-518.

Sarro, et al., "Study of Design Factors Affecting Turn-On Time of Silicon Controlled Rectifiers (SCRs) in 90 and 65NM Bulk CMOS Technologies", 44th Annual International Reliability Physics Sumposium, San Jose, 2006, IEEE, pp. 163-168.

TW Office Action with Search Report for Patent Appl. No. 101130697 dated Jun. 23, 2014.

Fan, et al., "A Novel Low Voltage Base-Modulated SCR ESD Device with Low Latch-up Risk", Published in EOS/ESD Symposium, conference held Aug./Sep. 2009, 10 pgs.

* cited by examiner

COMBINATION ESD PROTECTION CIRCUITS AND METHODS

CROSS-REFERENCE TO RELATED APPLICATION

This application is a continuation of U.S. patent application Ser. No. 13/216,147, filed Aug. 23, 2011, U.S. Pat. No. 8,611,058, issued Dec. 17, 2013. This application and patent are incorporated by reference herein in their entirety and for all purposes.

TECHNICAL FIELD

Embodiments of the invention relate generally to integrated circuits, and more particularly, in one or more of the illustrated embodiments, to circuitry combining an I/O driver with an electrostatic discharge protection device.

BACKGROUND OF THE INVENTION

Integrated circuits are connectable to "the outside world" through input nodes, output nodes, or input/output nodes such as bond pads, input pads, input/output pins, die terminals, die pads, contact pads, and so forth. Buffer circuitry, often configured as an inverter or a plurality of inverters, is interposed between such nodes and active circuitry of the integrated circuit. The buffer circuitry typically includes transistors which should be protected from over-limit electrical conditions, for example, voltages and/or currents caused by electrostatic discharge (ESD) during handling, testing and operation of the integrated circuit. Subjecting a device to ESD is referred to as an ESD event. An ESD event is an example of an over-limit electrical condition that may cause damage to the circuitry of the integrated circuit unless adequately protected. Typically, an ESD protection circuit is associated with one of the above-mentioned nodes.

Typical ESD protection circuits include circuitry that provides a low-impedance conductive path to a reference voltage such as ground and/or to a voltage supply such as VCC, to dissipate (e.g., shunt) the voltage and/or current associated with the ESD event before operational circuitry of the integrated circuit is damaged. As an example of a conventional protection circuit for an output circuit with a pull-up and a pull-down transistor forming an inverter, a diode may be coupled in parallel with the pull-up transistor, a diode may be coupled in parallel with the pull-down transistor, and an ESD clamp may be coupled between VCC and ground. In this case, for example, should an large positive voltage (with respect to a reference voltage, such as ground) from an ESD event be provided to the output node, the transient ESD current may flow up through the diode coupled in parallel with the pull-up transistor, and through the ESD clamp to ground. The transient ESD current may also flow from the output node to ground directly through the pull-down transistor of the driver circuit. A transient ESD current associated with a large negative voltage (with respect to a reference voltage, such as ground) may similarly be dissipated'.

Although some transistors may be capable of shunting some transient ESD current without damaging circuit components, other transistors may be damaged as a result of any ESD current at all. For example, high-speed input or output circuits (or other specialized circuit components) may tolerate little to no transient ESD current. In other words, some circuits may not be self-protecting. Also, as semiconductor devices continue to shrink, they become more prone to and less tolerant of ESD events. And, even if the transistors or other circuit components can tolerate a small level of transient ESD current and/or voltage, the triggering voltage of the diode or other protection circuit element may be higher than the breakdown voltage of, for example, the transistors. In this case, dedicated ESD circuits may be added, in addition to diodes, in order to help clamp the ESD voltage and/or current levels below the breakdown voltage or breakdown current of the transistors.

Some dedicated ESD circuits include circuit components that exhibit a "snap-back" characteristic. Generally, a snap-back characteristic provides a trigger condition which when exceeded, causes the circuit to enter a low-impedance state. The low-impedance state is maintained while the electrical condition on a node exceeds a hold condition. Examples of conventional circuits having snapback characteristics include thyristors, such as silicon-controlled rectifiers (SCRs), and overdriven metal-oxide-semiconductor (MOS) transistors.

In designing an adequate protection circuit using a snap-back circuit, the trigger condition must be sufficiently low to provide protection before a breakdown condition occurs for operational circuitry. Examples of conventional circuits having a set trigger condition, and typically a set hold condition as well, include diode-triggered SCRs (DTSCRs). Once set, however, adjusting (e.g. changing, altering, etc.) the trigger condition, often requires redesign of the protection circuit. That is, the protection circuits are typically "hard-wired" and are not modified after the integrated circuit is fabricated. Also, trigger conditions for ESD protection and protection against latch-up conditions are often different, thus, having a protection circuit with a trigger condition set to protect against one condition may be a compromise for protecting against the other over-limit electrical conditions. Moreover, adding a dedicated ESD circuit may increase the capacitance seen at the input or output node, which may be unacceptable in high-speed I/O circuits. In addition to exhibiting low capacitance, adequate protection circuits for high-speed applications may in some cases need to be able to dissipate high levels of current, switch on with fast transient response times, and not cause undesirable latch-up.

DETAILED DESCRIPTION

Certain details are set forth below to provide a sufficient understanding of embodiments of the invention. However, it will be clear to one skilled in the art that embodiments of the invention may be practiced without these particular details. Moreover, the particular embodiments of the present invention described herein are provided by way of example and should not be used to limit the scope of the invention to these particular embodiments. In other instances, well-known circuits, control signals, timing protocols, and software operations have not been shown in detail in order to avoid unnecessarily obscuring the invention.

Figure 1:
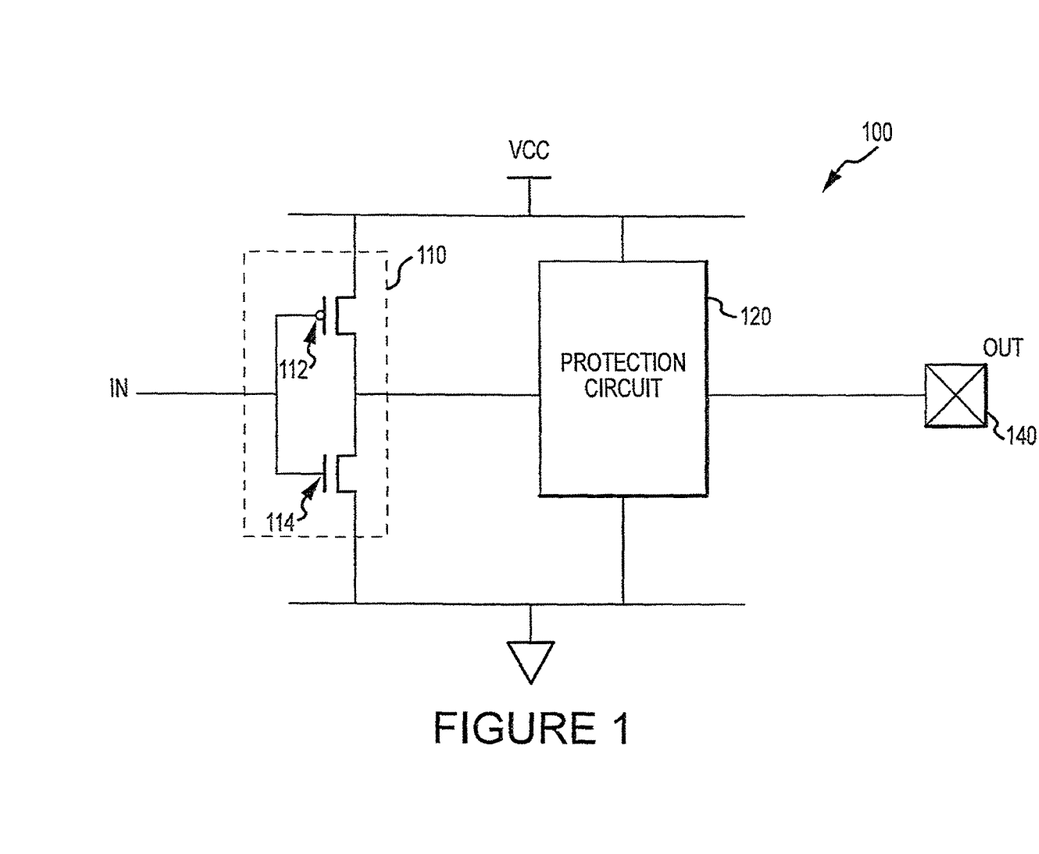
FIG. 1 is a schematic diagram of an output circuit with a driver circuit and a protection circuit according to an embodiment of the present invention.

FIG. 1 illustrates an output circuit 100 according to an embodiment of the invention. The output circuit 100 includes a driver circuit 110 and a protection circuit 120. The output circuit 100 is configured to receive an input signal IN at an input node and provide an output signal OUT to an output node 140 responsive at least in part to the IN signal. The input and output nodes may represent signal nodes of the output circuit 100. The output node 140 may represent an output node of an integrated circuit that is exposed to a surrounding environment.

In the embodiment of FIG. 1, the driver circuit 110 is illustrated as an inverter formed with a pull-up transistor 112 and a pull-down transistor 114. The pull-up transistor 112 may be a p-channel field effect transistor (pFET) and the pull-down transistor 114 may be an n-channel FET (nFET). The driver circuit may invert the IN signal, buffer and/or amplify it, and provide the OUT signal to the output node 140, either directly or indirectly after passing through some other circuitry, such as a protection circuit 120. In some embodiments, the driver circuit may include a plurality of inverters, or may be any kind of circuit that prepares an input signal (e.g., the IN signal) to be provided to an output node.

A protection circuit 120, shown coupled in parallel with the driver circuit 110 in FIG. 1, is configured to help protect the driver circuit 110 from harmful events. For example, the protection circuit 120 may help protect the transistors 112, 114 of the driver circuit 110 from electrostatic discharge (ESD) or other electrical or magnetic noise events. Although ESD or other noise may come from any source within the integrated circuit (such as an over-voltage or over-current event), it may also come from an external source via the output node 140 or other external node. For example if a user touches a finger or a metallic part or any other object to the output node 140, that contact may induce an ESD event. The protection circuit 120 may help dissipate (e.g., shunt) the voltage and/or current associated with ESD or other event. The protection circuit 120 may further help limit (e.g., clamp) the voltage and/or current. In some cases, one or both of the transistors of the driver circuit 110 may also be able to shunt some of the current, but in other cases the transistors may be delicate and susceptible to failure should they be subjected to the voltage and/or current. For example, in embodiments having a driver circuit 110 that is a high-speed output driver circuit having thin gate oxide transistors, the transistors may not be capable of sufficiently dissipating the ESD event and damaged as a result.

The protection circuit 120 may include any of a number of different devices. For example, the protection circuit may include one or more diodes and/or one or more thyristors (e.g., SCRs). The protection circuit may also include one or more complementary FETs, resistors, or any other components capable of dissipating voltage and/or current. In some embodiments, the protection circuit 120 may include a VCC-ground ESD clamp. Although FIG. 1 illustrates a protection circuit 120 in parallel with the driver circuit 110, a protection circuit may also be placed in series with the transistors of the driver circuit or even merged with the transistors of the driver circuit, as discussed in more detail below. Also, although FIG. 1 describes an output circuit 100 of an integrated circuit, input circuits and other circuits within an integrated circuit may be susceptible to ESD or other noise. For convenience, protection circuits for the output circuit are described in detail below, but it is to be understood that the concepts disclosed herein also apply to input circuits and other internal circuits in an integrated circuit, and are not limited to output circuitry.

Figure 2:
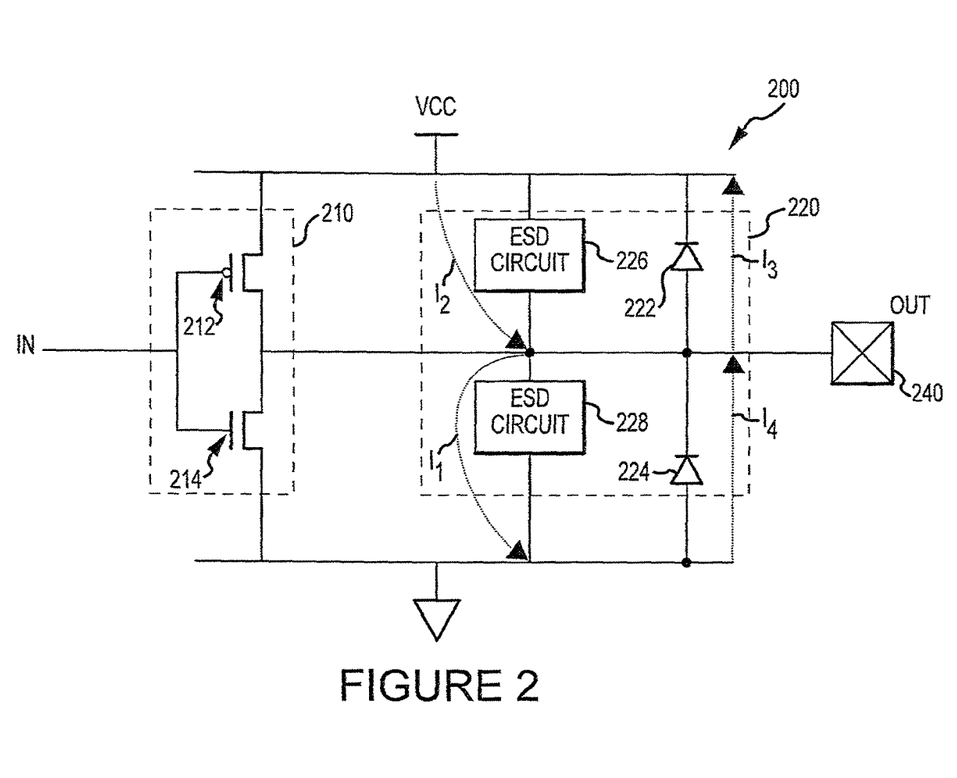
FIG. 2 is a schematic diagram of an output circuit with a driver circuit and ESD protection circuits according to an embodiment of the invention.

FIG. 2 illustrates an output circuit 200 according to an embodiment of the invention. The output circuit 200 includes a driver circuit 210 and a protection circuit 220. The driver circuit 210 is similar to that shown in FIG. 1, and includes pull-up transistor 212 and pull-down transistor 214. The protection circuit 220 includes a diode 222 and an ESD circuit 226 in parallel with each other and with the pull-up transistor 212 of the driver circuit 210. The protection circuit 220 also includes a diode 224 and an ESD circuit 228 in parallel with each other and with the pull-down transistor 214. Should an ESD event occur on an output node 240 of the output circuit 200, the ESD circuits 226, 228 may help shunt the ESD current, thereby protecting the transistors 212, 214 in the driver circuit 210 from the ESD current and/or voltage. In some embodiments, a VCC-ground ESD clamp (not shown in FIG. 2) may also be added as part of the protection circuit 220. The protection circuit 220 provides current paths for various ESD conditions. For example, the protection circuit 220 is configured to conduct current from the output node 240 to power nodes such as a reference voltage node, for example, a ground node, and a voltage supply node, for example, a VCC node. The protection circuit 220 is further configured to conduct current from the voltage supply node to the reference voltage node and from the reference voltage node to the voltage supply node.

In operation, the protection circuit 220 protects the driver circuit 210 by shunting at least some current resulting from an ESD event rather than having the transistors 212, 214 manage that current. For example, the protection circuit 220 will conduct current from the output node 240 to the voltage supply node and/or to the reference voltage node through the diode 222 (i.e., current I3) and ESD circuit 228 (i.e., current I1), respectively, responsive to a positive (relative to VCC and ground) ESD voltage provided to the output node 240. The protection circuit 220 will also conduct current from the output node 240 to the voltage supply node and/or to the reference voltage node through the ESD circuit 226 (i.e., current I2) and diode 224 (i.e., current I4), respectively, responsive to a negative (relative to VCC and ground) ESD voltage provided to the output node 240.

Although FIG. 2 illustrates the protection circuit including an ESD circuit 226, 228 for each of the pull-up transistor 212 and pull-down transistor 214, respectively, the protection circuit may include one ESD circuit to provide ESD protection for either the pull-up transistor 212 or the pull-down transistor 214. For example, in some embodiments the protection circuit may include ESD circuit 228 for the pull-down transistor 214 but not include ESD circuit 226. Conversely, in other embodiments the protection circuit may include ESD circuit 226 for the pull-up transistor 212 but not include ESD circuit 228. Such embodiments may be used where reducing the size of the protection circuit is desirable. Additionally, where either the pull-up or pull-down transistor is configured to have sufficient ESD self-protection it may be unnecessary to further include an additional ESD circuit for the transistor.

Figure 3:
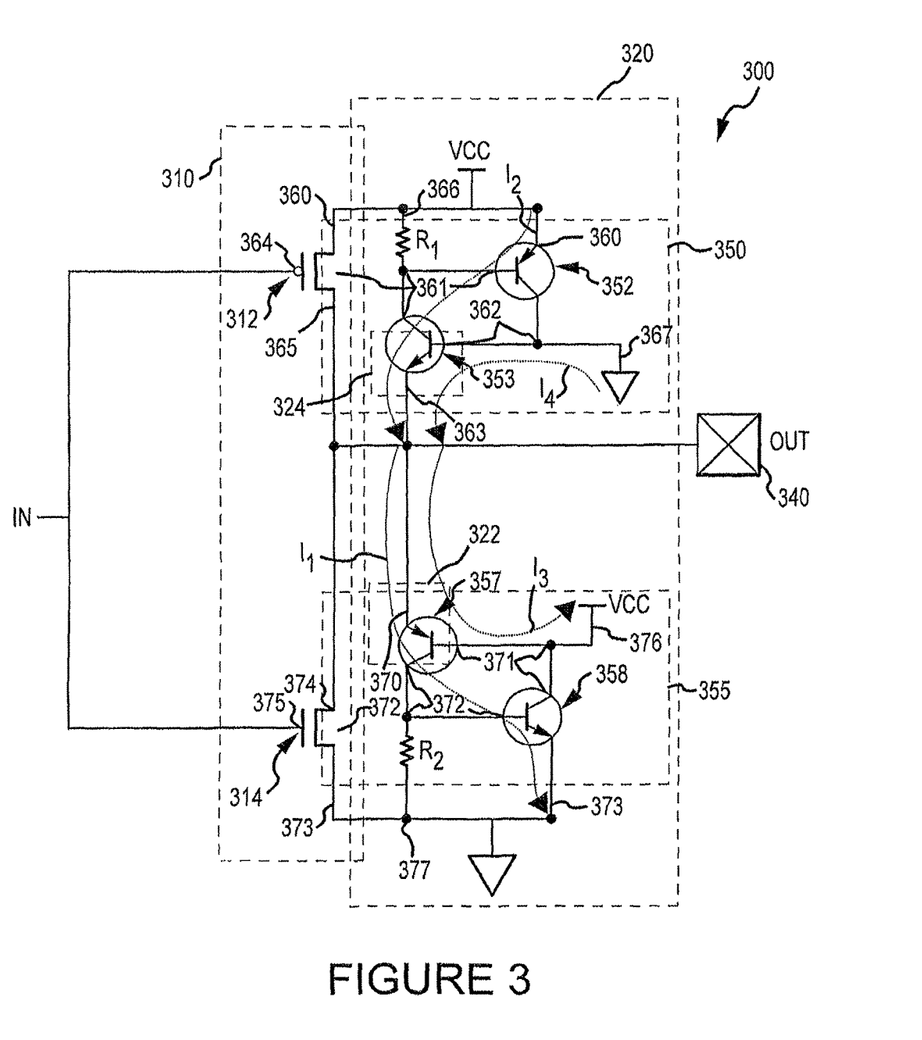
FIG. 3 is a schematic diagram of a combination output circuit/ESD protection circuit according to an embodiment of the invention.

FIG. 3 illustrates an output circuit 300 according to an embodiment of the invention. The output circuit 300 may be included in an I/O circuit. The output circuit 300 includes a driver circuit 310 and a protection circuit 320. The driver circuit 310 includes pull-up transistor 312 and pull-down transistor 314. The protection circuit 320 includes a silicon-controlled rectifier (SCR) 350 coupled in parallel with the pull-up transistor 312 and further includes a SCR 355 coupled in parallel with the pull-down transistor 314. The SCR 350 further provides a diode 324 coupled to a reference voltage node, for example, ground and output node 340. The SCR 355 further provides a diode 322 coupled to output node 340 and a voltage supply node, for example, VCC. The diodes 324 and 322 represent diodes 224 and 222, respectively of FIG. 2. The output circuit 300 may be useful in, among other things, high-speed switching applications. Rather than having an ESD or other protection circuit distinct from the driver circuit, portions of the driver circuit 310 are merged with portions of the protection circuit 320. For example, the pull-up transistor 312 and the pull-down transistor 314 of the output circuit 300 may be merged with the SCRs 350, 355 that act as protection circuits.

In some embodiments, the output circuit 300 may have the SCR 350 merged with the pull-up transistor 312. The SCR 350 is "merged" with the pull-up transistor in that the body of the pull-up transistor shares an n-well 361 with at least a portion of the SCR 350, as will be explained below in connection with FIG. 4. Returning to FIG. 3, however, the SCR 350 may be visualized as including two bipolar junction transistors (BJT) 352, 353 and diode 324: a first BJT 352 may be a pnp-type BJT with its emitter coupled to voltage supply node, for example, VCC, its base coupled to the collector of a second, npn-type BJT 353, and its collector coupled to the base of the second BJT 353 and further coupled to a reference voltage node, for example, ground. The emitter of the second BJT 353 may be coupled to the output node 340, which further provides diode 324.

Figure 4:
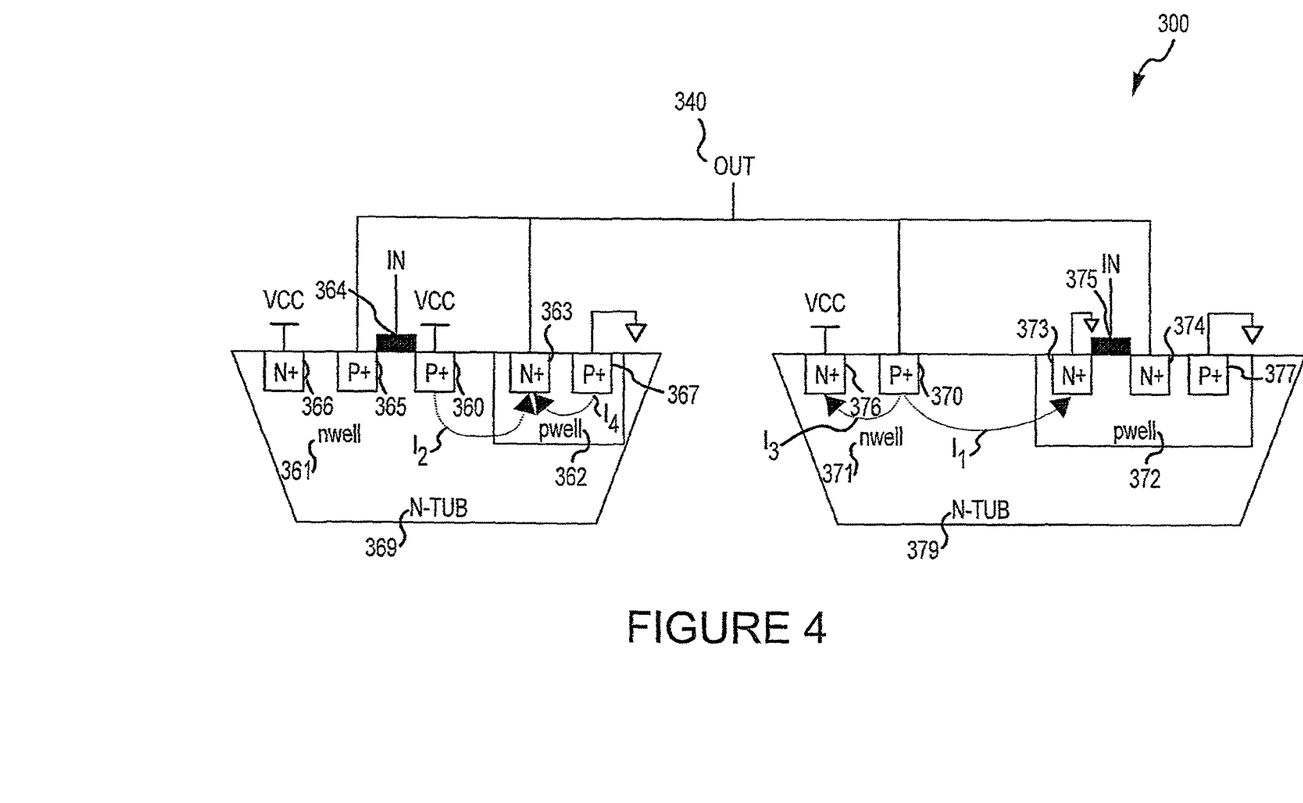
FIG. 4 is a cross-sectional diagram of an integrated circuit implementing the combination output circuit/ESD protection circuit of FIG. 3 according to an embodiment of the invention

Although FIG. 3 illustrates the first BJT 352 and the second BJT 353 as separate devices, as illustrated in FIG. 4 and discussed below, the two BJTs 352, 353 may not be separate but rather may share doped regions and thus form a p-n-p-n type thyristor, rather than form two distinct BJTs. For example, the base of the first BJT 352 may share the same doped region (an n-well 361) on an integrated circuit as the collector of the second BJT 353, and the collector of the first BJT 352 may share the same doped region (a p-well 362) on the integrated circuit as the base of the second BJT 353. The diode 324 may comprise the p-well 362 and an n+ region 363 which acts as the emitter for the second BJT 353. Additionally, as mentioned above, the body of the pull-up p-type transistor 312 may be formed in the n-well 361 in which the base of the first BJT 352 and the collector of the second BJT 353 are formed.

The output circuit 300 may also include an SCR 355 merged with a pull-down transistor 314. The SCR 355 is "merged" with the pull-down transistor 314 in that the body of the pull-down transistor may share a p-well 371 with at least a portion the SCR 355, as will be explained below in connection with FIG. 4. Returning to FIG. 3, however, the SCR 355 may be visualized as including two bipolar junction transistors (BJT) 357, 358: a third BJT 357 may be a pnp-type BJT with its emitter coupled to the output node 340, its base tied to the collector of a fourth, npn-type BJT 358 (which may be tied to VCC), and its collector tied to the base of the fourth BJT 358. The emitter of the fourth BJT 358 may be tied to ground. The diode 322 is provided by the emitter-base of the third BJT 357 that is coupled to the output node 340 and VCC.

Although FIG. 3 illustrates the third BJT 357 and the fourth BJT 358 as separate devices, as illustrated in FIG. 4 and discussed below, the two BJTs 357, 358 may not be separate but rather may share doped regions and thus form a p-n-p-n type thyristor, rather than form two distinct BJTs. For example, the base of the third BJT 357 may share the same doped region (an n-well 371) on an integrated circuit as the collector of the fourth BJT 358, and the collector of the third BJT 357 may share the same doped region (a p-well 372) on the integrated circuit as the base of the fourth BJT 358. The diode 322 may comprise the n-well 371 and a p+ region 370 which acts as the emitter for the third BJT 353. Additionally, the body of the pull-down n-type transistor 314 may share the p-well 372 that is the collector of the third BJT 357 and the base of the fourth BJT 358.

In operation, the SCR 350 provides current paths from VCC and ground to the output node 340 (i.e., currents I2 and I4, respectively) and the SCR 355 provides current paths from the output node 340 to both ground and VCC (i.e., currents I1 and I3, respectively). As known, SCRs exhibit a "snapback" current-voltage relationship when triggered. The snapback characteristics of the SCRs 350, 355 are advantageously used to protect the transistors 312, 314. The transistors 312, 314 of the driver circuit 310 may be used as trigger circuits for the SCRs 350, 355, respectively, that may effectively lower the trigger voltages for the SCRs 350, 355; moreover, the trigger voltages may effectively be lowered even further through base modulation, as discussed below. As a result, the SCRs 350, 355 may trigger at a sufficiently low voltage to conduct current resulting from an ESD event and to further clamp the voltage across the transistors 312, 314 to a low enough voltage to prevent the transistors 312, 314 from being damaged by the ESD event.

FIG. 4 illustrates a cross-section view of the output circuit 300 of FIG. 3 according to an embodiment of the invention implemented in a triple-well structure, with both an n-well and a p-well within an N-tub. The n-well and N-tub are doped with an n-type dopant and the p-well is doped with a p-type dopant. In some embodiments, however, the output circuit 300 may be implemented in a dual-well structure on an intrinsic substrate wafer.

In addition to illustrating a cross-section view of the SCRs 350, 355 described above, FIG. 4 also illustrates the pull-up and pull-down driver transistors 312, 314. The pull-up transistor 312 includes a gate 364, a source 360 (which shares the same doped region as the emitter of the first BJT 352 described above) coupled to VCC, and a drain 365 coupled to the output node 340. Also, the pull-down transistor 314 includes a gate 375, a drain 374 coupled to the output node 340, and a source 373 coupled to ground (which shares the same doped region as the emitter of the fourth BJT 358 described above). FIG. 4 also illustrates that the n-well 361 is coupled to VCC through an n+ doped region 366 (effectively creating resistance R1 shown in FIG. 3), and also illustrates that the p-well 372 is coupled to ground through a p+ doped region 377 (effectively creating resistance R2 shown in FIG. 3)

The output circuit 300 may provide ESD protection with a relatively low capacitance load. The active area coupled to the output node 340 is similar to that in a conventional ESD diode-only scheme, thus providing a low output node capacitance. Though the pull-up and pull-down transistors 312, 314 embedded within the output circuit may not be able to handle ESD current and/or voltage alone, the closely coupled SCRs 350, 355 may be triggered by ESD events (as explained below) and may be able to clamp the over-voltage and/or shunt the over-current in order to protect the transistors 312, 314 that form the driver circuit 310.

In operation, the SCRs 350, 355 in the output circuit 300 may be triggered (e.g., turned on) by, for example, an ESD event. Referring to the SCR 355 and the pull-down transistor 314, should an ESD voltage provided to the output node 340 exceed a trigger voltage during an ESD event, the transistor 314 may enter a condition (e.g., reverse-biasing of the body 372-drain 374 junction) resulting in a leakage current that increases the voltage of the p-well 372 as the leakage current passes through resistance R2 to ground. As the voltage of the p-well 372 increases the base (372)-emitter (373) junction of the fourth BJT 358 may become forward biased. A resulting collector (371) current of the fourth BJT 358 reduces the voltage of the base (371) of the third BJT 357 and the ESD voltage provided to output node 340 forward biases the emitter (370)-base (371) junction of the third BJT 357 to trigger the SCR 355 "on" thereby switching from its previous high impedance state to a low impedance state. The ESD current may then flow into the p-well 372 and from there it may be shunted to ground because of the forward-bias of the base (372)-emitter (373) junction of the fourth BJT 358 (i.e., current I1). In other words, the transistor 314 may act as a triggering element for the SCR 355 because as a positive ESD voltage is applied to the output node 340, the transistor 314 enters a reverse-bias condition. The reverse-bias condition results in a leakage current that flows from the output node 340 through the p-well 372 and to ground, which increases the voltage of the base 372 of the fourth BJT 358 because of the resistance R2, and in turn lowers the trigger point for the SCR 355.

Referring to the SCR 350 and the pull-up transistor 312, should an ESD voltage provided to the output node 340 be more negative than a trigger voltage during an ESD event, the transistor 312 may enter a condition (e.g., reverse-biasing of the drain 365-body 361 junction) resulting in a leakage current that decreases the voltage of the n-well 361 as the leakage current passes through resistance R1 to the output node 340. As the voltage of the n-well 361 decreases the base (361)-emitter (360) junction of the first BJT 352 may become forward biased. A resulting collector (362) current of the first BJT 352 increases the voltage of the base (362) of the second BJT 353 and the ESD voltage provided to output node 340 forward biases the base (362)-emitter (363) junction of the second BJT 353 to trigger the SCR 350 "on" thereby switching from its previous high impedance state to a low impedance state. The ESD current may then flow from VCC into the p-well 362 and to the output node 340 due to the lower-than-ground ESD voltage applied at the output node (i.e., current I2). In other words, the transistor 312 may act as a triggering element for the SCR 350 because as a negative ESD voltage is applied to the output node 340, the transistor 312 enters a reverse-bias condition. The reverse-bias condition results in a current that flows from VCC 366 through the n-well 361 and to the output node 540, which decreases the voltage of the collector 361 of the second BJT 352 because of the resistance R1, and in turn lowers the trigger point for the SCR 350.

Additionally, during an ESD event that results in a positive voltage provided to the output node 340, the diode 322 of SCR 355 shunts current (i.e., current I3) from the output node 340 to VCC and clamps the voltage across the pull-up transistor 312 to prevent damage. During an ESD event that results in a negative voltage provided to the output node 340, the diode 324 of SCR 350 shunts current (i.e., current I4) from ground to the output node 340 and also clamps the voltage across the pull-down transistor 314 to prevent damage.

Although FIGS. 3 and 4 illustrate an embodiment of the output circuit 300 with an SCR 350 merged with the pull-up transistor 312 and an SCR 355 merged with the pull-down transistor 314, in some embodiments, the output circuit 300 may only have a SCR merged with either the pull-up or pull-down transistor 312, 314. For example, the output circuit 300 may only have an SCR merged with the pull-down transistor 314 that is formed by an n-type transistor because n-type transistors are generally more sensitive to ESD events than, for example, a p-type transistor that may be used for a pull-up transistor. In other words, although a p-type transistor may in some instances be manufactured such that it is tolerant of certain ESD events, a corresponding n-type transistor may be more difficult to make tolerant of the ESD events. Therefore, the output circuit 300 may include one or two SCRs merged with either one or both of the transistors 312, 314 of the driver circuit 310.

Also, although FIGS. 3 and 4 show two SCR-transistor combination circuits formed in two different N-tubs 369 and 379, in some embodiments, two SCR-transistor combination circuits may be formed in a single N-tub. Additionally, a VCC-ground ESD clamp (not shown) may be added in some but not all embodiments to the output circuit 300 shown in FIGS. 3 and 4 in order to further improve the ESD characteristics of the device.

Additionally, although the SCRs 350, 355 are each illustrated as a pair of BJTs, each may be a single p-n-p-n device as mentioned above. For example, the first SCR 350 may be thought of as a p (360)-n (361)-p (362)-n (363) device, while the second SCR 355 may be a p (370)-n (371)-p (372)-n (373) device.

Figure 5:
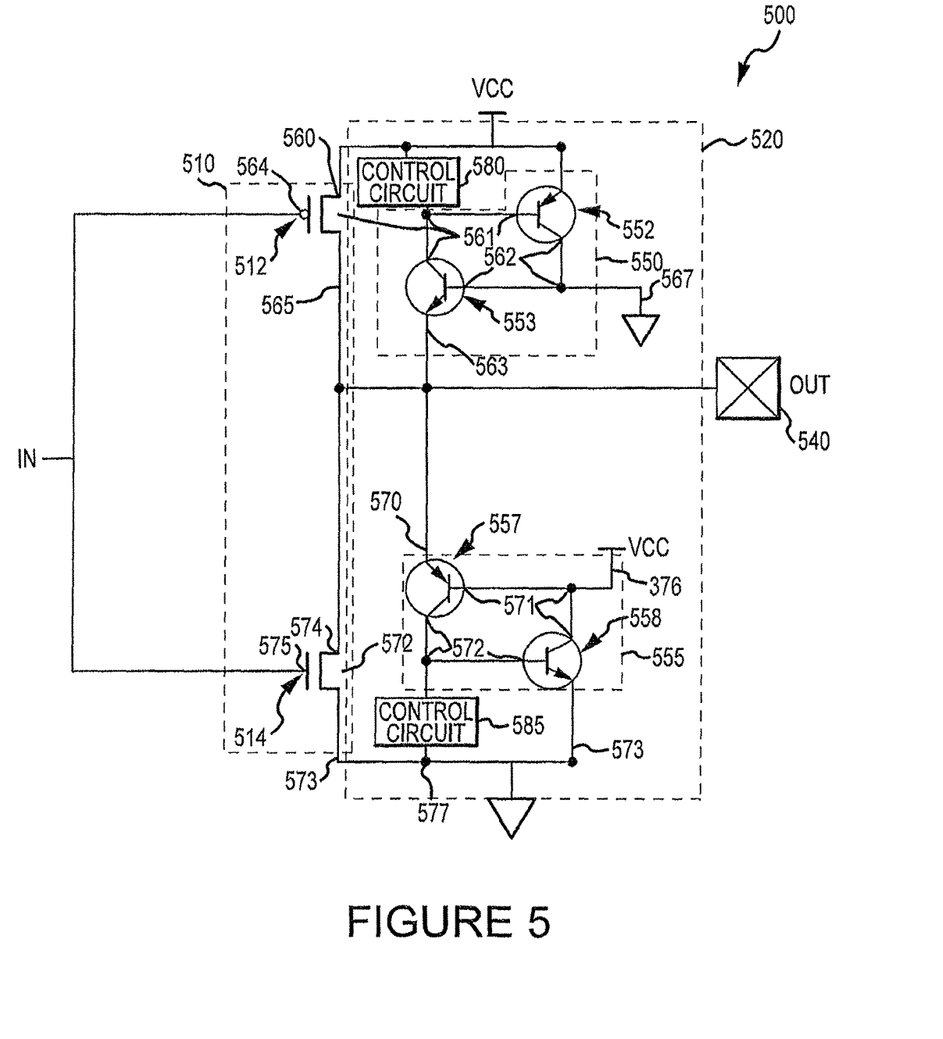
FIG. 5 is a schematic diagram of a combination output circuit/ESD protection circuit with base modulation according to an embodiment of the invention.

FIG. 5 illustrates an output circuit 500 according to another embodiment of the invention. The output circuit 500 is similar to the output circuit 300 shown in FIG. 3, and includes a driver circuit 510 and a protection circuit 520. The output circuit 500 shown in FIG. 5, however, also includes control circuits 580, 585. The control circuits may modulate the effective resistance of the n-well 561 and the p-well 572 in order to set a first (e.g., low) trigger point of the SCRs 550, 555 during, for example, ESD events, or set a second (e.g., high) trigger point of the SCRs during, for example, a power-up cycle and normal operation.

The operation of output circuit 500 may be similar to the operation of output circuit 300, in that the SCR 550, when triggered, provides current paths from VCC and ground to the output note 540 and the SCR 555, when triggered, provides current paths from the output node 540 to both ground and VCC. As with the output circuit 300 in FIG. 3, the transistors 512, 514 of the output circuit 500 may be used as trigger circuits for the SCRs 550, 555, respectively. As described above, the transistors 512, 514 effectively lower the trigger voltages for the SCRs 550, 555 because the leakage current that flows through the base of the transistors during an ESD event increases the voltage of the n-well 561 and p-well 572 due to the inherent resistance of the wells—and that increased well voltage in turn lowers the triggering point for the SCRs 550, 555 respectively.

The control circuits 580, 585 in the output circuit 500 in FIG. 5, however, allow the effective resistance of the n-well 561 and p-well 572 to be selectively increased beyond their inherent resistance to further lower the SCR trigger point during, for example, ESD events. By increasing the effective resistance of the n-well 561 and p-well 572, the control circuit increases the voltage of the wells because the leakage current flowing through the respective well stays the same while the resistance is increased. In other words, by increasing well resistance (e.g., by adding additional resistance via a control circuit), the control circuits 580, 585 decrease the amount of the leakage current required to raise the voltage of the well. The increased voltage of the n-well and p-well may in turn cause the SCRs 550, 555 to trigger at a lower ESD voltage applied at the output node 540.

The control circuits 580, 585 also allow the effective resistance of the wells 561, 572 to remain at their inherent levels, for example, following power-up and during normal operation, so that the SCRs 550, 555 do not trigger based on acceptably normal power spikes that may occur during certain operation cycles of the output circuit 500. If the power spike has relatively high voltage and/or current levels that can induce damages to the output circuits, or if there is an ESD event, the control circuits shall capture these changes, and switch mode to provide high resistance for the wells 561 and 572, to allow the SCRs to trigger at low voltage. In some embodiments, the control circuits may allow the effective resistance of one or more wells to be varied over a range of values.

As one example of how the output circuit 500 with the control circuits 580, 585 may be operated, the control circuits may increase well resistance (thereby lowering the SCR trigger point) while the output circuit 500 is turned off. Having a low SCR trigger point may increase the ESD sensitivity of the output circuit, which may facilitate dissipation of undesirable current generated by an ESD event during the handling or testing of the device. While the output circuit 500 is powered-on, the control circuits 580, 585 may decrease well resistance (thereby increasing the SCR trigger point). Having a higher SCR trigger point may prevent the output circuit from interpreting a power spike as an ESD event. When the device is turned on and in a stable state, the control circuits 580, 585 may be tuned to capture high voltage/current events (e.g., ESD events and extreme power spikes) during normal operation, and then optionally again increase well resistance to again lower the SCR trigger point.

Figure 6:
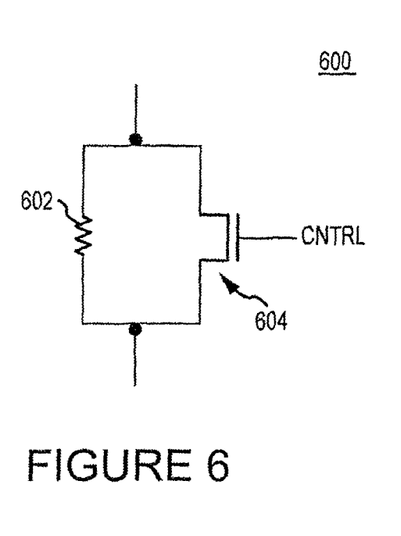
FIG. 6 is a schematic diagram of a control circuit according to an embodiment of the invention.

FIG. 6 illustrates one embodiment of a control circuit 600 that may be used to modulate the effective resistance of a well region in an integrated circuit based at least in part on a CNTRL signal. The control circuit 600 includes a resistance 602 coupled in parallel with an n-channel FET 604, with the CNTRL signal applied to the gate of the nFET. In some embodiments, the body of the nFET may be coupled to the same voltage node to which the source of the nFET is coupled. In some embodiments, the resistance is implemented as a relatively high resistance, for example, 50-100 kohms. The control circuits 580, 585 of FIG. 5 may be implemented as the control circuit 600 of FIG. 6 in order to modulate the trigger points of the SCRs 550, 555.

For convenience, the operation of control circuit 600 will be discussed as if it were implemented as the control circuit 585 of the output circuit 500 of FIG. 5. Under a first condition with CNTRL=0 volts, the nFET 604 of the control circuit 600 behaves as an open circuit, thereby presenting an added resistance to the p-well 572 provided by the resistance 602. The added resistance may increase the overall effective resistance of the p-well 572, and, as a result, the current required to forward bias the base 572 to emitter 573 junction is decreased, thereby decreasing the trigger voltage of the SCR 555. In contrast, if CNTRL>0 volts, the nFET 604 becomes conductive, and the overall resistance of the p-well 572 will decrease, thereby increasing the current required to forward bias the base 572 to emitter 573 junction and increasing the trigger voltage of the SCR 555. When CNTRL=VCC volts, the nFET 604 of the control circuit may be fully turned on, essentially acting as a low resistance path (e.g., a short). In this case, the effective resistance of the p-well 572 may be approximately the same as the inherent resistance of the well.

As described above, the CNTRL signal may be nearly 0 volts when an integrated circuit is unpowered, which causes the resistance of the p-well 572 to be large, which may cause the trigger voltage for the SCR 555 to be low. This may provide greater ESD protection to the output circuit 500 because less current and/or voltage may be required to trigger the SCR to discharge the over current/voltage from an ESD event. After power-up of the integrated circuit, however, the CNTRL signal may be raised to reduce the resistance added by the control circuit, which may increase the triggering voltage of the SCR and correspondingly increase the latch-up immunity of the output circuit. The CNTRL signal may in some embodiments, the CNTRL signal may be reduced when either an ESD event or extreme power spikes/noise is captured during normal operation, to again increase the resistance of the p-well 572, and thereby decrease the trigger voltage of the SCR 555.

While the above discussion of control circuit 600 describes a fixed resistance 602 in parallel with an nFET 604, the control circuit 600 may have many other configurations, such as a variable resistor or other variable impedance components, as well known in the art.

Figure 7:
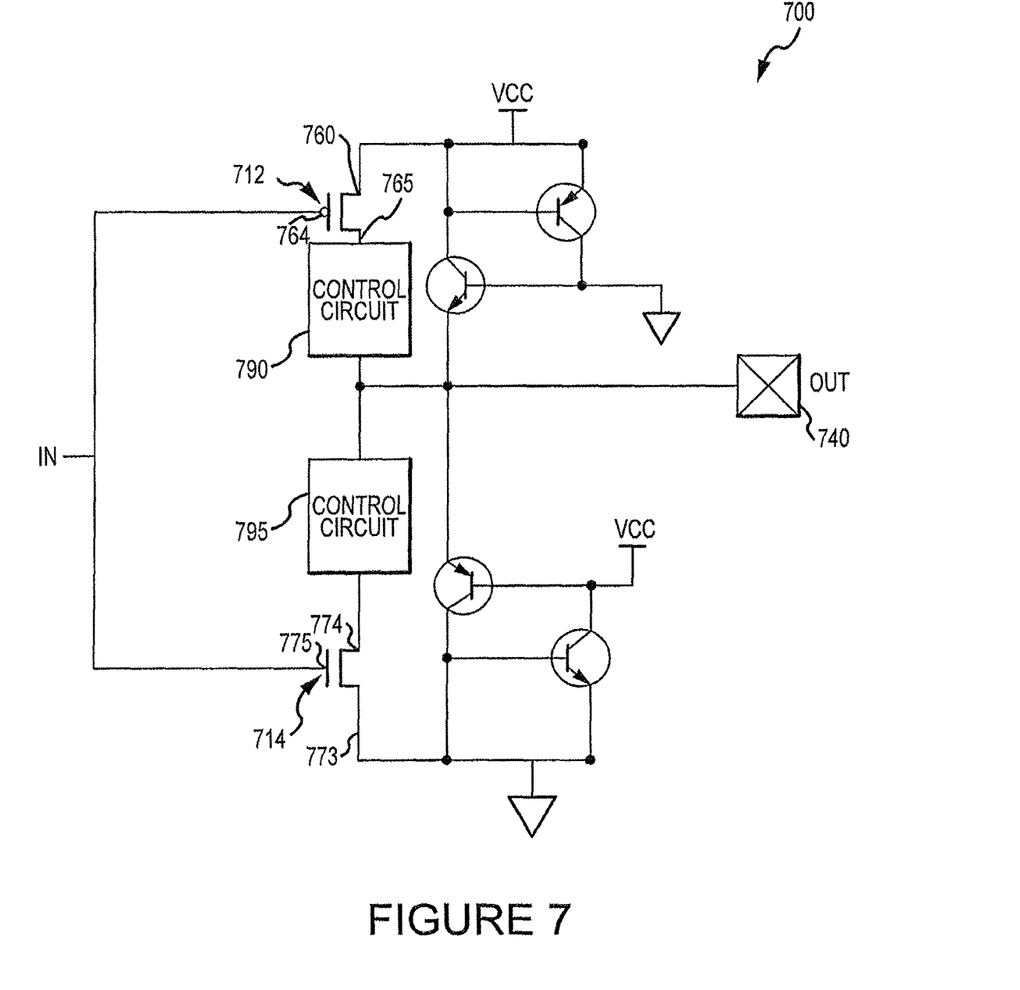
FIG. 7 is a schematic diagram of a combination output circuit/ESD protection circuit with two control circuits according to an embodiment of the invention.

FIG. 7 illustrates an output circuit 700 according to another embodiment of the invention. The output circuit 700 is similar to output circuit 300 in FIG. 3 or output circuit 500 in FIG. 5, except that a control circuit 790 is coupled between the drain 765 of the pull-up transistor 712 and the output node 740, and a control circuit 795 is coupled between the drain 774 of the pull-down transistor 714 and the output node 740. Adding control circuits 790 and 795 to the output circuit 700 may allow the drive strengths of the pull-up and pull-down transistors to be tuned, and may also reduce the ESD current flowing through the transistors for a given ESD voltage as compared with an output circuit without control circuits 790, 795. The control circuit may be implemented using conventional circuits of the output circuit 700, for example, on-die termination (ODT) resistances. In some embodiments, output circuit 700 may have only one of the control circuits 790, 795, both of the control circuits, or neither of the control circuits.

Figure 8:
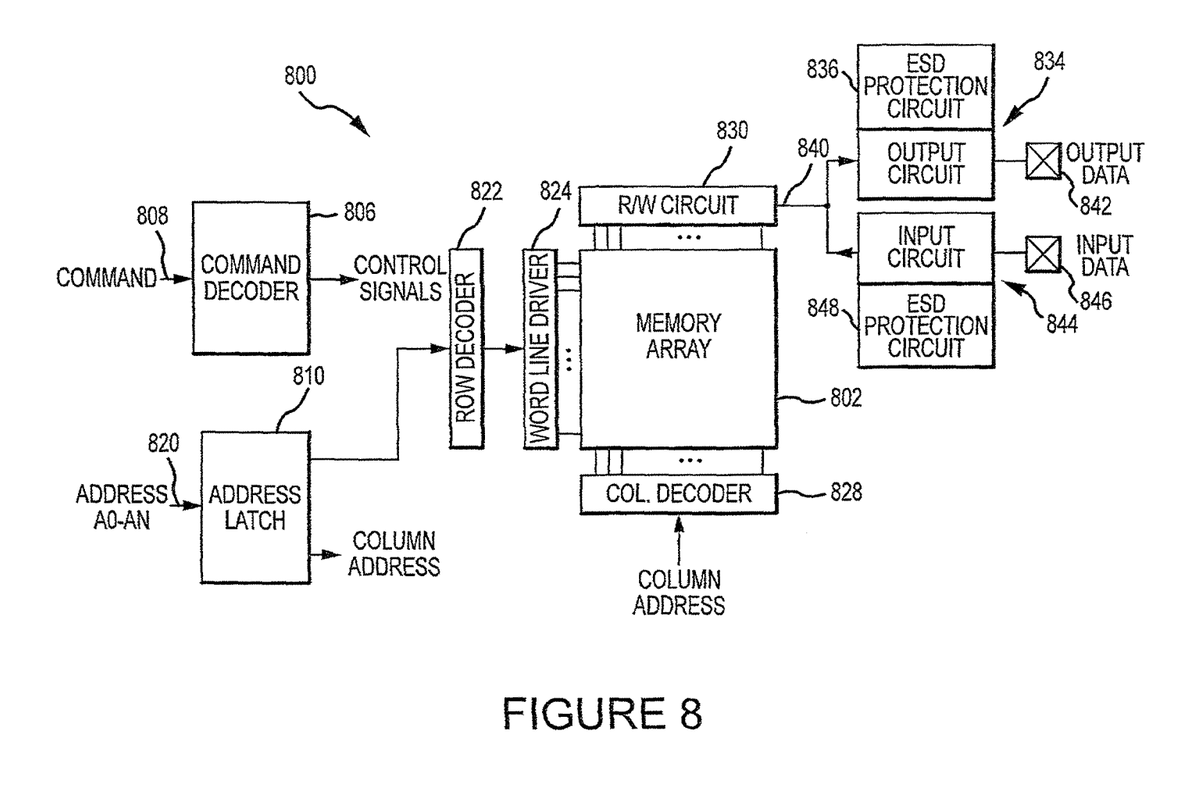
FIG. 8 is a block diagram of a memory system having input and output circuits with ESD protection circuits according to an embodiment of the invention.

FIG. 8 illustrates a portion of a memory 800 according to an embodiment of the present invention. The memory 800 includes an array 802 of memory cells, which may be, for example, DRAM memory cells, SRAM memory cells, flash memory cells, or some other types of memory cells. The memory 800 includes a command decoder 806 that receives memory commands through a command bus 808 and generates corresponding control signals within the memory 800 to carry out various memory operations. Row and column address signals are applied to the memory 800 through an address bus 820 and provided to an address latch 810. The address latch then outputs a separate column address and a separate row address.

The row and column addresses are provided by the address latch 810 to a row address decoder 822 and a column address decoder 828, respectively. The column address decoder 828 selects bit lines extending through the array 802 corresponding to respective column addresses. The row address decoder 822 is connected to word line driver 824 that activates respective rows of memory cells in the array 802 corresponding to received row addresses. The selected data line (e.g., a bit line or bit lines) corresponding to a received column address are coupled to a read/write circuitry 830 to provide read data to a data output circuit 834 via an input-output data bus 840. An output pad 842 coupled to the data output circuit 834 is used for electrically coupling to the memory 800. Write data are applied to the memory array 802 through a data input circuit 844 and the memory array read/write circuitry 830. An input pad 846 coupled to the data input circuit 842 is used for electrically coupling to the memory 800. The command decoder 806 responds to memory commands applied to the command bus 808 to perform various operations on the memory array 802. In particular, the command decoder 806 is used to generate internal control signals to read data from and write data to the memory array 802.

In some embodiments, the output circuit 834 and the input circuit 844 include ESD protection circuits 836 and 848, such as SCRs, merged with output and input buffers, respectively. The ESD protection circuits 836 and 848 protect circuitry of the memory 800 in the event a relatively high-voltage/high-current signal is applied to the output or input pads 842, 846, such as from an ESD event. Additionally, as previously discussed, the ESD protection circuits 836, 848 may allow for modulating the trigger conditions for the SCRs included in the protection circuits. In some embodiments, the ESD protection circuits 836, 848 can be used in power-up sequences for the memory 800, as previously discussed. That is, while no power is applied to the memory 800, the trigger conditions for the protection circuits 836, 848 are relatively low. In contrast, during power up, or after power has been applied to the memory 800, the trigger conditions for the protection circuits 836, 848 are modulated to a higher trigger condition relative to when no power is applied.

From the foregoing it will be appreciated that, although specific embodiments of the invention have been described herein for purposes of illustration, various modifications may be made without deviating from the spirit and scope of the invention. For example, FIGS. 3, 5, and 7 illustrate embodiments of a protection circuit that includes similar ESD circuits used for both pull-up and pull-down transistors 312, 314. However, the ESD circuits of the protection circuits are not limited to having the same design, and may be of different designs and include different circuitry from one another. For example, in some embodiments the protection circuit includes an SCR coupled in parallel to the pull-down transistor but uses a different circuit coupled in parallel to the pull-up transistor 312, for example, other thyristors, MOS circuits, or other circuits. Likewise, in other embodiments the protection circuit includes an SCR coupled in parallel to the pull-up transistor but uses a different circuit coupled in parallel to the pull-down transistor. Accordingly, the invention is not limited except as by the appended claims.

What is claimed is:

1. An integrated circuit, comprising:
a thyristor formed from a plurality of doped regions; and
a transistor with a source;
wherein a first doped region one of the plurality of doped regions of the thyristor is shared with the source of the transistor and wherein the first doped region is included in a doped well region, and wherein none of the plurality of doped regions of the thyristor is shared with a drain of the transistor.

2. An integrated circuit, comprising:
a thyristor formed from a plurality of doped regions wherein the thyristor is configured as a protection circuit; and
a transistor with a source, wherein the transistor is a protected transistor, and a drain of the protected transistor is not used as part of the protection circuit,
wherein a first doped region one of the plurality of doped regions of the thyristor is shared with the source of the transistor and wherein the first doped region is included in a doped well region.

3. An integrated circuit, comprising:
a thyristor formed from a plurality of doped regions; and
a transistor with a source;
wherein a first doped region one of the plurality of doped regions of the thyristor is shared with the source of the transistor and wherein the first doped region is included in a doped well region, and wherein a second doped region of the plurality of doped regions of the thyristor is also the body of the transistor.

4. The integrated circuit of claim 3, wherein the second doped region of the plurality of doped regions is coupled to a power node through a variable resistance.

5. The integrated circuit of claim 3, wherein the thyristor is configured to be triggered responsive to an increased voltage of the second doped region of the plurality of doped regions.

6. An integrated circuit, comprising:
a thyristor formed from a plurality of doped regions; and
a transistor with a drain;
wherein none of the plurality of doped regions of the thyristor is shared with the drain of the transistor.

7. The integrated circuit of claim 6, wherein the thyristor and the transistor are coupled between a power node and an output node, and the thyristor is configured to conduct current from a noise event on the output node to the power node responsive to a triggering event caused by the transistor.

8. The integrated circuit of claim 7, wherein the thyristor is configured to protect the transistor from the noise event on the output node by switching to a low impedance state.

9. The integrated circuit of claim 6, wherein the plurality of doped regions of the thyristor comprise:
a first doped region coupled to a power node;
a second doped region coupled to the first doped region;
a third doped region coupled to the second doped region;
a fourth doped region coupled to the second doped region and to an output node; and
a fifth doped region coupled to the output node, wherein the first doped region, the second doped region, the fifth doped region, and a gate together form the transistor.

10. An integrated circuit, comprising:
a protected transistor including a source; and
a protection circuit at least partially merged with the protected transistor, the protection circuit including first and second transistors, and further including a plurality of doped regions,
wherein a body of the protected transistor is formed in a well in which a base of the first transistor and a collector of the second transistor are formed,
wherein the source of the protected transistor is a same doped region as at least one of the plurality of doped regions of the protection circuit, and
wherein the protection circuit is triggered using a leakage current, the leakage current increasing a voltage of the well and the increased voltage of the well forward biases a junction between the well and the source of the protected transistor.

11. The integrated circuit of claim 10, wherein the protected transistor is coupled to a power node and an output node.

12. The integrated circuit of claim 11, wherein the power node is one of a voltage reference node or a voltage supply node.

13. The integrated circuit of claim 11, further comprising a diode coupled between the power node and the output node.

14. The integrated circuit of claim 13, wherein the diode is coupled to the power node through a resistance.

15. The integrated circuit of claim 14, wherein the resistance is configured to be modulated.

16. A method, comprising:
triggering a thyristor that is at least partially merged with a transistor in a same doped region using a leakage current, the leakage current increasing a voltage of the doped region, wherein the doped region is a first doped region, the increased voltage of the first doped region forward biases a junction between the first doped region and a second doped region, and the second doped region is coupled to a power node.

17. The method of claim 16, wherein the leakage current is provided by the transistor responsive to a noise event at a signal node.

18. The method of claim 17, further comprising conducting current resulting from the noise event to a power node through the triggered thyristor.

19. The method of claim 16, wherein the transistor and thyristor are coupled between a signal node and a power node, and are configured to conduct current resulting from a noise event to the power node responsive to said triggering of the thyristor.

* * * * *